United States Patent
Togawa et al.

(10) Patent No.: US 10,038,416 B2
(45) Date of Patent: Jul. 31, 2018

(54) SELF-OSCILLATING CLASS D AMPLIFIER

(71) Applicant: YAMAHA CORPORATION, Hamamatsu-shi (JP)

(72) Inventors: Takeshi Togawa, Hamamatsu (JP); Masao Noro, Hamamatsu (JP)

(73) Assignee: YAMAHA CORPORATION, Hamamatsu-Shi (JP)

( * ) Notice: Subject to any disclaimer, the term of this patent is extended or adjusted under 35 U.S.C. 154(b) by 0 days.

(21) Appl. No.: 15/468,329

(22) Filed: Mar. 24, 2017

(65) Prior Publication Data
US 2017/0279421 A1    Sep. 28, 2017

(30) Foreign Application Priority Data

Mar. 25, 2016 (JP) .................................. 2016-062740

(51) Int. Cl.
*H03F 3/217* (2006.01)
*H03F 3/185* (2006.01)

(52) U.S. Cl.
CPC ........... *H03F 3/2171* (2013.01); *H03F 3/185* (2013.01); *H03F 3/217* (2013.01); *H03F 3/2173* (2013.01);
(Continued)

(58) Field of Classification Search
CPC ...... H03F 3/217; H03F 3/2171; H03F 3/2173; H03F 3/38; H03F 2200/351;
(Continued)

(56) References Cited

U.S. PATENT DOCUMENTS

| 4,178,556 A | * | 12/1979 | Attwood | ................. H03F 3/217 330/251 |
| 6,249,182 B1 | * | 6/2001 | Pullen | ................... H03F 3/2171 330/251 |

(Continued)

FOREIGN PATENT DOCUMENTS

| JP | 61021007 B2 | 5/1986 |
| JP | 2003110375 A | 4/2003 |
| WO | 2005114833 A2 | 12/2005 |

OTHER PUBLICATIONS

Copending U.S. Appl. No. 15/468,440, filed Mar. 24, 2017.
(Continued)

*Primary Examiner* — Khanh V Nguyen
(74) *Attorney, Agent, or Firm* — Rossi, Kimms & McDowell LLP

(57) ABSTRACT

A self-oscillating class D amplifier includes an integration circuit configured to integrate an input signal and output a result of the integration as an integrated signal, a comparator configured to receive the integrated signal at an inverting input terminal and output a pulse width modulation signal by comparing voltages of a non-inverting input terminal being grounded and the inverting input terminal, a switching circuit configured to power-amplify the pulse width modulation signal output from the comparator, a low-pass filter configured to extract an amplified output signal from the power-amplified pulse width modulation signal, a first feedback circuit configured to feed back the output signal of the low-pass filter to the inverting input terminal of the comparator, and a second feedback circuit configured to feed back the output signal of the low-pass filter to the integration circuit.

5 Claims, 4 Drawing Sheets

(52) U.S. Cl.
CPC .... *H03F 2200/03* (2013.01); *H03F 2200/171* (2013.01); *H03F 2200/351* (2013.01); *H03F 2200/78* (2013.01)

(58) Field of Classification Search
CPC ........ H03F 2200/432; H03F 1/04; H03F 1/34; H03F 2200/78; H03M 1/504; H03M 1/822; H04L 25/4902
USPC ........................................ 330/10, 207 A, 251
See application file for complete search history.

(56) References Cited

U.S. PATENT DOCUMENTS

| | | | |
|---|---|---|---|
| 6,707,337 B2 | 3/2004 | Noro | |
| 7,221,216 B2* | 5/2007 | Nguyen | H03F 1/32 |
| | | | 330/251 |
| 7,279,970 B2* | 10/2007 | Yokoyama | H03F 3/217 |
| | | | 330/103 |
| 7,498,781 B2* | 3/2009 | Canfield | H02M 3/158 |
| | | | 323/280 |
| 9,352,557 B2* | 5/2016 | Takagi | B41J 2/04541 |
| 2003/0058039 A1* | 3/2003 | Noro | H03F 3/2173 |
| | | | 330/10 |
| 2006/0006933 A1 | 1/2006 | Nguyen | |
| 2006/0197596 A1 | 9/2006 | Chen et al. | |
| 2007/0188222 A1 | 8/2007 | Nguyen | |

OTHER PUBLICATIONS

European Search Report issued in European Application No. 17162759.9 dated Apr. 28, 2017.
Lu et al. "A Self Oscillating Class D Audio Amplifier with 0.0012% THD+N and 116.5 dB Dynamic Range" Custom Integrated Circuits Conference (CICC) 2010 IEEE, IEEE, Piscataway, NJ, pp. 1-4, Sep. 19, 2010.

* cited by examiner

SELF-OSCILLATING CLASS D AMPLIFIER

CROSS REFERENCE TO RELATED APPLICATIONS

This application is based on Japanese Patent Application (No. 2016-062740) filed on Mar. 25, 2016, the contents of which are incorporated herein by reference.

BACKGROUND OF THE INVENTION

1. Field of the Invention

The present disclosure relates to a self-oscillating class D amplifier.

2. Description of the Related Art

Self-oscillating class D amplifiers have been known conventionally as a type of amplifier for power-amplifying signals such as audio signals (for example, refer to JP-B-61-21007).

FIG. 4 shows a circuit example of a conventional self-oscillating class D amplifier. An operational amplifier 42 and a capacitor 43 constitute an integrator for integrating the audio signal input through the input terminal 41 of the amplifier. A comparator 44 compares the output of the operational amplifier 42 with the feedback output from a first feedback circuit described below and outputs a PWM (pulse width modulation) signal. A switch driving circuit 45 drives a switch circuit 46 based on the PWM signal output from the comparator 44.

The switch circuit 46 is configured by two power transistors (for example, FETs) connected to positive and negative power supplies. When driven by the switch driving circuit 45, the switch circuit 46 amplifies electric power of the PWM signal, or in other words power-amplifies the PWM signal and outputs the amplified signal. A low-pass filter (LPF), configured by an inductor 47 and a capacitor 48, removes the carrier component from the PWM signal output from the switch circuit 46 and demodulates (extract) the power-amplified audio signal. Numeral 53 designates an output terminal of the amplifier to be connected to a load, such as a speaker.

The first feedback circuit, configured by a resistor 49 and a capacitor 50, feeds back the output signal of the output terminal 53 to the inverting input terminal of the comparator 44. The loop circuit, configured by the comparator 44, the switch driving circuit 45, the switch circuit 46, the LPF (the inductor 47 and the capacitor 48) and the first feedback circuit (the resistor 49 and the capacitor 50), self-oscillates at a frequency f0 at which the phase delay of the audio signal going around the loop circuit is 180 degrees. The self-oscillation frequency f0 can be adjusted by changing the delay of the first feedback circuit.

A second feedback circuit, configured by resistors 51 and 52, feeds back the output signal of the output terminal 53 to the inverting input terminal of the operational amplifier 42. This feedback route applies negative feedback to the audio band and determines the gain of the amplifier in the audio band.

In the circuit described above referring to FIG. 4, in the case of designing an amplifier having high overall gain and high output power, it is assumed that high voltage fluctuations (for example, ±100 V) may occur in the voltage at the output terminal 53. In such a case, input voltage having fairly large fluctuations is also assumed to be input to an input side of the circuit. Hence, the input voltage applied to the comparator 44 has large fluctuations. Furthermore, since the amplifier is a self-oscillation type, a feedback signal for self-oscillation fed back from the output side is applied to the input signal of the comparator 44. As a result, there is a problem that a semiconductor device having a fairly high breakdown voltage is required to be used as the comparator 44.

SUMMARY OF THE INVENTION

An object of the present disclosure is to suppress voltage fluctuations at the input signal of a comparator for performing pulse width modulation, whereby a semiconductor device having a considerably high breakdown voltage is not required to be used as the comparator.

In order to attain the above-mentioned object, there is provided a self-oscillating class D amplifier comprising:

an integration circuit configured to integrate an input signal and output a result of the integration as an integrated signal;

a comparator, having a non-inverting input terminal being grounded and an inverting input terminal, and configured to receive the integrated signal at the inverting input terminal and output a pulse width modulation signal by comparing voltages of the non-inverting input terminal and the inverting input terminal;

a switching circuit configured to power-amplify the pulse width modulation signal output from the comparator;

a low-pass filter configured to extract an amplified output signal from the power-amplified pulse width modulation signal;

a first feedback circuit configured to feed back the output signal of the low-pass filter to the inverting input terminal of the comparator; and a second feedback circuit configured to feed back the output signal of the low-pass filter to the integration circuit.

With the present disclosure, in the self-oscillating class D amplifier, since the non-inverting input terminal of the comparator for performing pulse width modulation is grounded and a sum signal of the output signal from the integration circuit for integrating the input signal and the feedback signal from the first feedback circuit for self-oscillation is input to the inverting input terminal of the comparator, the voltage fluctuations at the input signal of the comparator can be suppressed, whereby the present disclosure is advantageous in that a semiconductor device having a high breakdown voltage is not required to be used as the comparator.

DETAILED DESCRIPTION OF THE EXEMPLARY EMBODIMENTS

Embodiments according to the present disclosure will be described below referring to the accompanying drawings.

Figure 1:
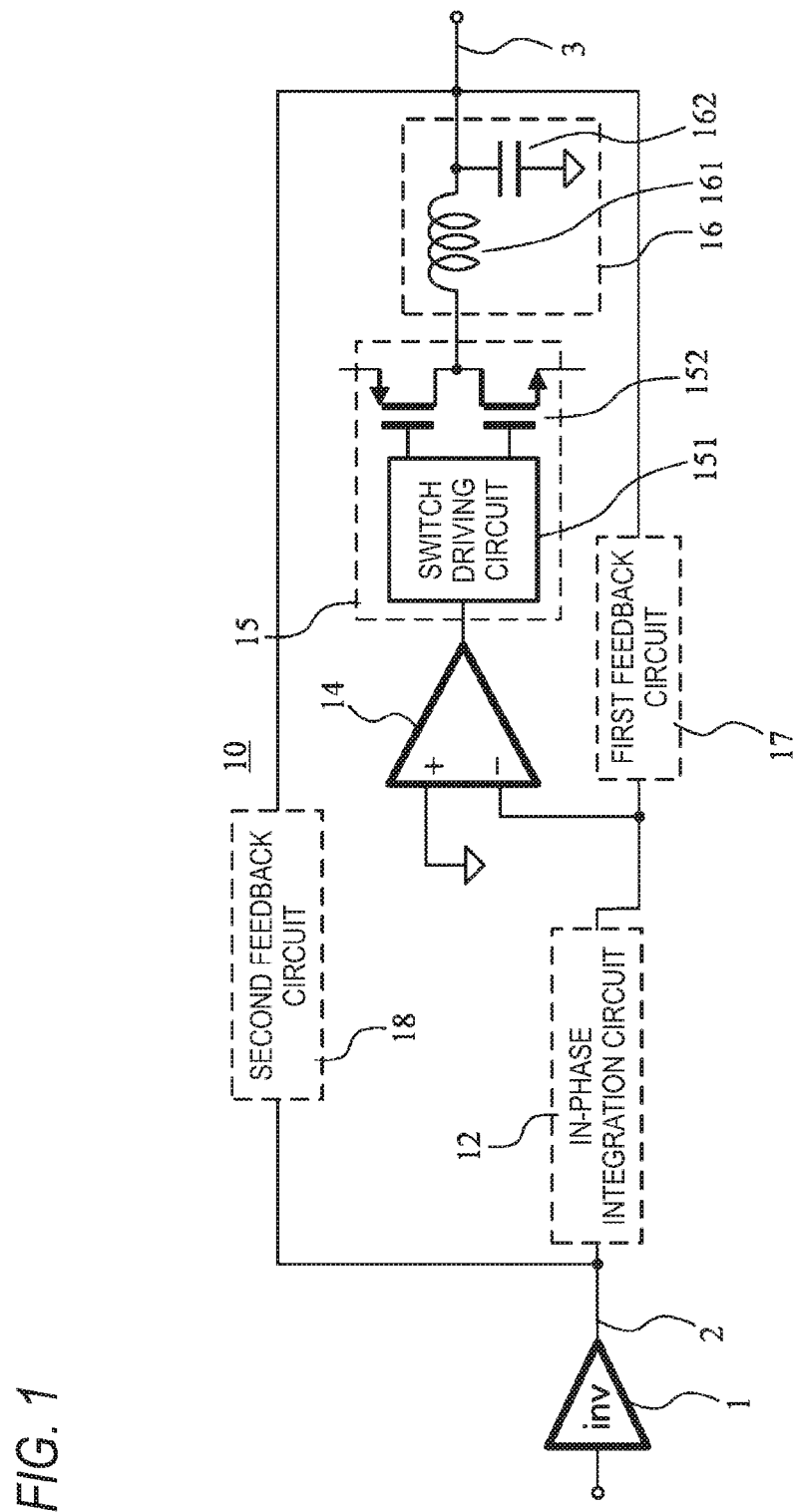
FIG. 1 is a circuit diagram of a self-oscillating class D amplifier according to a first embodiment of the present disclosure.

FIG. 1 is a circuit diagram of a self-oscillating class D amplifier 10 according to the first embodiment of the present disclosure. An inverter 1 (an inverting amplifier) inverts and amplifies an input audio signal and delivers the inverted signal to the input terminal 2 of the amplifier 10. Since both of the inverter 1 and the amplifier 10 invert an audio signal, the two devices connected in series operate as a single non-inverting amplifier. Numeral 3 designates the output of the amplifier 10.

The amplifier 10 is equipped with an integration circuit 12, a comparator 14, a switching circuit 15, an LPF 16, a first feedback circuit 17 and a second feedback circuit 18.

The integration circuit 12 integrates the audio signal delivered to the input terminal 2 of the amplifier 10 and containing a second feedback signal fed back by the second feedback circuit 18 and then outputs the integrated signal obtained as a result of the integration to the comparator 14. The comparator 14 compares the integrated signal coming from the integration circuit and containing a first feedback signal fed back by the first feedback circuit 17 with the reference voltage (ground voltage of the comparator 14), thereby generating a PWM signal that is obtained by PWM-modulating the audio signal delivered to the input terminal 2 in reverse phase and then outputting the PWM signal.

The switching circuit 15, configured by a switch driving circuit 151 and a switch circuit 152, power-amplifies the PWM signal output from the comparator 14 and outputs the power-amplified signal. The first LPF 16, configured by an inductor 161 and a capacitor 162, removes the carrier component (the frequency component of the self-oscillation) from the power-amplified PWM signal, demodulates (extracts) the power-amplified audio signal, and outputs the demodulated signal from the output 3 of the amplifier 10. The first feedback circuit 17 delays the audio signal output from the output 3 and feeds back, as the first feedback signal, the delayed signal to the integrated signal on the inverting input terminal side of the comparator 14. The amplifier 10 oscillates as a self-oscillating class D amplifier by virtue of this feedback. As in the conventional technology, the oscillation frequency f0 can be controlled by the amount of the delay. The second feedback circuit 18 feeds back, as the second feedback signal, the audio signal output at the output terminal 3 to the audio signal input to the integration circuit 12. This feedback is a so-called negative feedback and improves the distortion characteristics of the amplifier 10 in the audio band and determines the gain of the amplifier 10.

According to the circuit illustrated in FIG. 1, the non-inverting input terminal of the comparator 14 is grounded, and the voltage at the inverting input terminal of the comparator 14 does not swing so much around the center of the reference voltage. Hence, the comparator 14 is not required to have a relatively high breakdown voltage (endure ±30 V or more) and an ordinary semiconductor device having a relatively low breakdown voltage (±2 to 20 V) can be used as the comparator.

Figure 2:
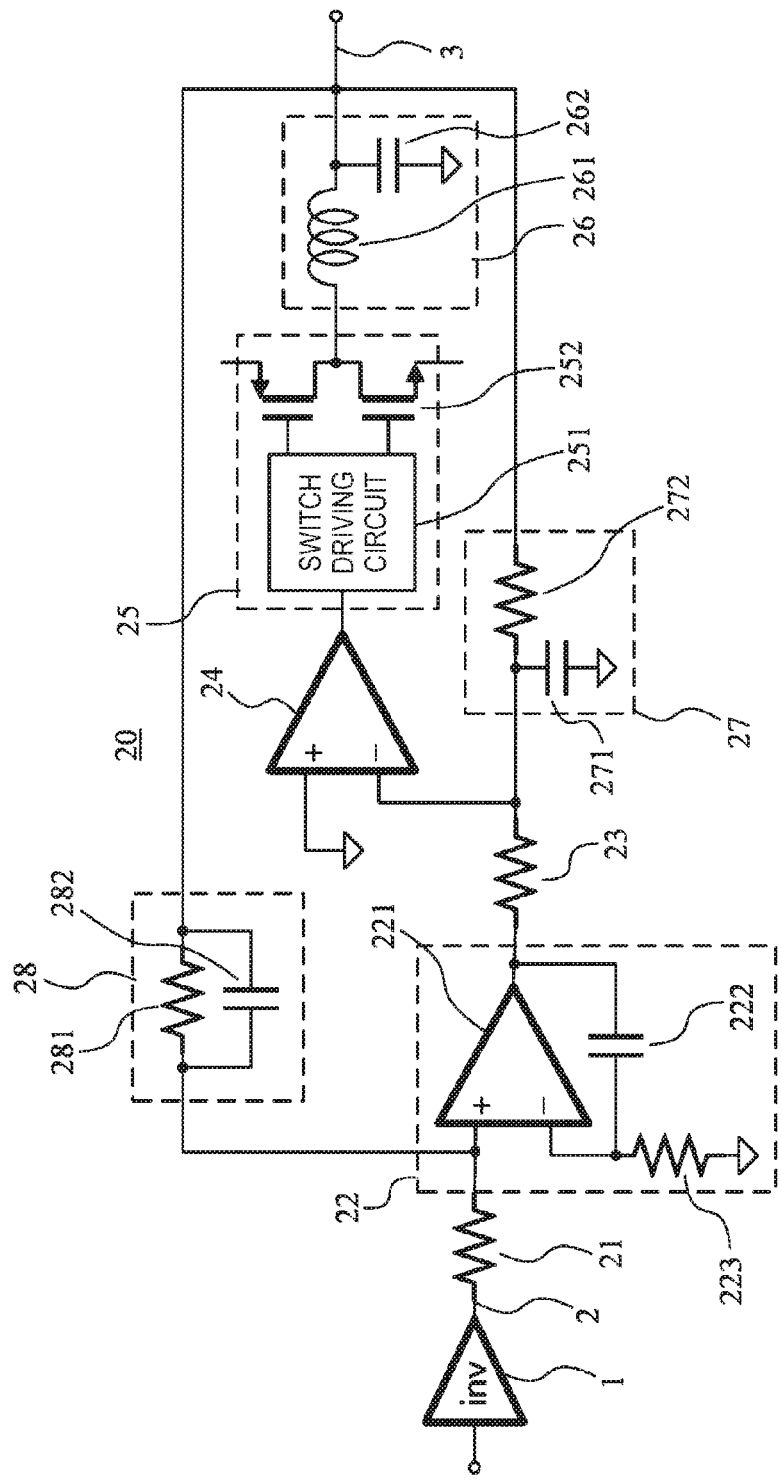
FIG. 2 is a circuit diagram of a self-oscillating class D amplifier according to a second embodiment of the present disclosure.

FIG. 2 is a circuit diagram of a self-oscillating class D amplifier 20 according to the second embodiment of the present disclosure. The inverter 1 and the input terminal 2 and the output terminal 3 of the amplifier 20 illustrated in FIG. 2 are almost identical to those illustrated in FIG. 1. Furthermore, the components 2* designated by numerals 20s in FIG. 2 correspond to the components 1* designated by numerals 10s in FIG. 1 and those corresponding to each other perform almost identical operations (* is a single-digit integer). The components 2 designated by numerals 200s in FIG. 2 correspond to the components 1 designated by numerals 100s in FIG. 1 and those corresponding to each other perform almost identical operations (** is a two-digit integer). However, the integration circuit 12, the first feedback circuit 17 and the second feedback circuit 18 illustrated in FIG. 1 are illustrated as more specific circuits in FIG. 2.

The non-inverting analog integration circuit 22 of the amplifier 20, configured by an operational amplifier 221, a capacitor 222 and a resistor 223, integrates the audio signal delivered to the input terminal 2 of the amplifier 20 and containing a second feedback signal fed back by the second feedback circuit 28 and then outputs the integrated signal obtained as the result of the integration to the comparator 24. The amplifier 20 herein operates as a single inverting amplifier whose gain in the audio band is determined by a resistor 21 (a first resistor) and a resistor 281, and the non-inverting input terminal of the operational amplifier 221 is grounded virtually. Hence, an ordinary semiconductor device having a low breakdown voltage can be used as the operational amplifier 121. In the second feedback circuit 28, a capacitor 282 is connected in parallel with the resistor 281, whereby the phase of the feedback signal is advanced and the amplifier 20 is stabilized (phase compensation).

The comparator 24 compares the integrated signal coming from the integration circuit 22 and containing a first feedback signal fed back by a first feedback circuit 27 with the reference voltage, thereby generating a PWM signal that is obtained by PWM-modulating the audio signal delivered to the input terminal 2 in reverse phase and then outputting the PWM signal. A switching circuit 25 power-amplifies the PWM signal coming from the comparator 24, and an LPF 26 demodulates (extracts) the power-amplified audio signal from the power-amplified PWM signal and outputs the demodulated signal. The first feedback circuit 27 delays the audio signal coming from the output 3 and feeds back, as the first feedback signal, the delayed audio signal to the audio signal coming from the integration circuit 22. The self-oscillation frequency of the loop circuit configured by the comparator 24, the switching circuit 25, the LPF 26 and the first feedback circuit 27 can be adjusted by changing the delay amount of the first feedback circuit 27.

Regarding the audio band, the circuit formed by adding a resistor 23 (second resistor) to this loop circuit operates as a single inverting amplifier in which the resistor 23 and a resistor 272 determine the gain of the amplifier, and the inverting input terminal of the comparator 24 is grounded virtually. Moreover, since LPF 26 almost removes the carrier component of the power-amplified PWM signal, only a small carrier component is fed back through the first feedback circuit 27. Since no high voltage is applied at the input terminal as described above, an ordinary semiconductor device having a low breakdown voltage can be used as the comparator 24.

The operation of the capacitor 282 of the second feedback circuit 28 will be described in more detail referring to the frequency characteristic diagram in FIG. 3A. In FIG. 3A, the horizontal axis represents frequency and the vertical axis represents gain (or attenuation rate). The solid line 301 in the figure indicates the frequency characteristics of the LPF 26; the gain is flat in the audio band and has a peak at around 30 kHz, and the gain decreases gradually as the frequency rises further. The broken line 302 indicates the frequency characteristics of an open loop gain in the case that the feedback by the second feedback circuit 28 in the range between the input terminal 2 and the output terminal 3 of the amplifier 20 is not provided. However, the gain of the characteristics of the LPF 26 indicated by the solid line 301 is lifted by the gain of the loop circuit so that the gain is aligned with the gain indicated by the broken line 302 in the frequency bands higher than the pole frequency (30 kHz). The open loop gain indicated by the broken line 302 is high in the low frequency bands due to the presence of the integration circuit 22. The solid line 303 indicates the characteristics of the integration circuit.

The solid line 304 indicates the frequency characteristics of the closed loop gain of the amplifier 20 in the case that feedback is performed by using the second feedback circuit 28 that is not provided with the capacitor 28. Although the gain in the audio band is made flat by the feedback, the phase of the feedback signal is delayed 180 degrees and a peak appears at a frequency several times as high as the pole frequency, and the operation of the amplifier 20 becomes unstable. Hence, the capacitor 282 is provided in parallel with the resistor 281 to advance (compensate) the phase of the feedback signal and to secure a phase margin, thereby suppressing the peak indicated by the line 305.

The broken line 306 indicates the frequency characteristics of the closed loop gain of the amplifier 20 with feedback by the second feedback circuit 28 with the capacitor 28. The peak indicated by the line 305 in the frequency band at which the operation of the amplifier becomes unstable is suppressed by the phase compensation, whereby the operation of the amplifier becomes stable.

Figure 3B:
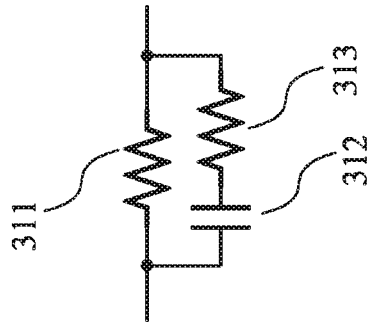
FIG. 3B is a view showing a modification of the second feedback circuit.
Figure 3A:
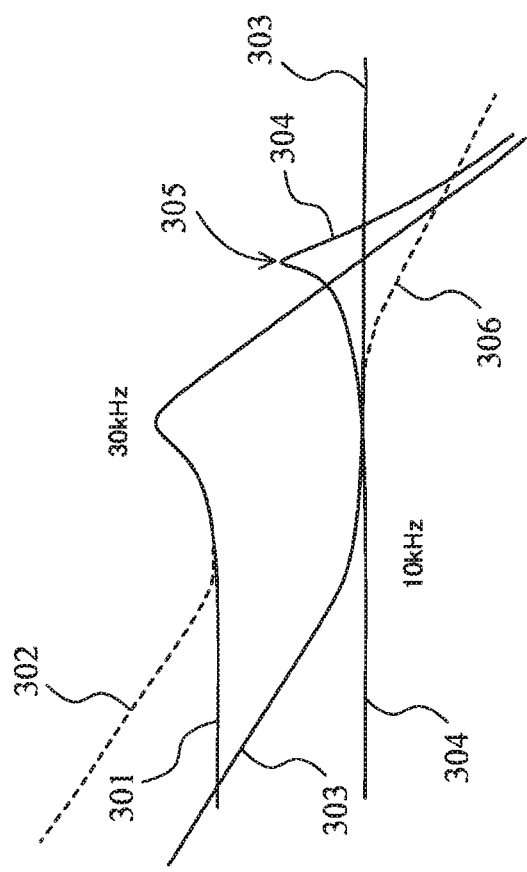
FIG. 3A is a view showing an operation of a capacitor of a second feedback circuit.
Figure 4:
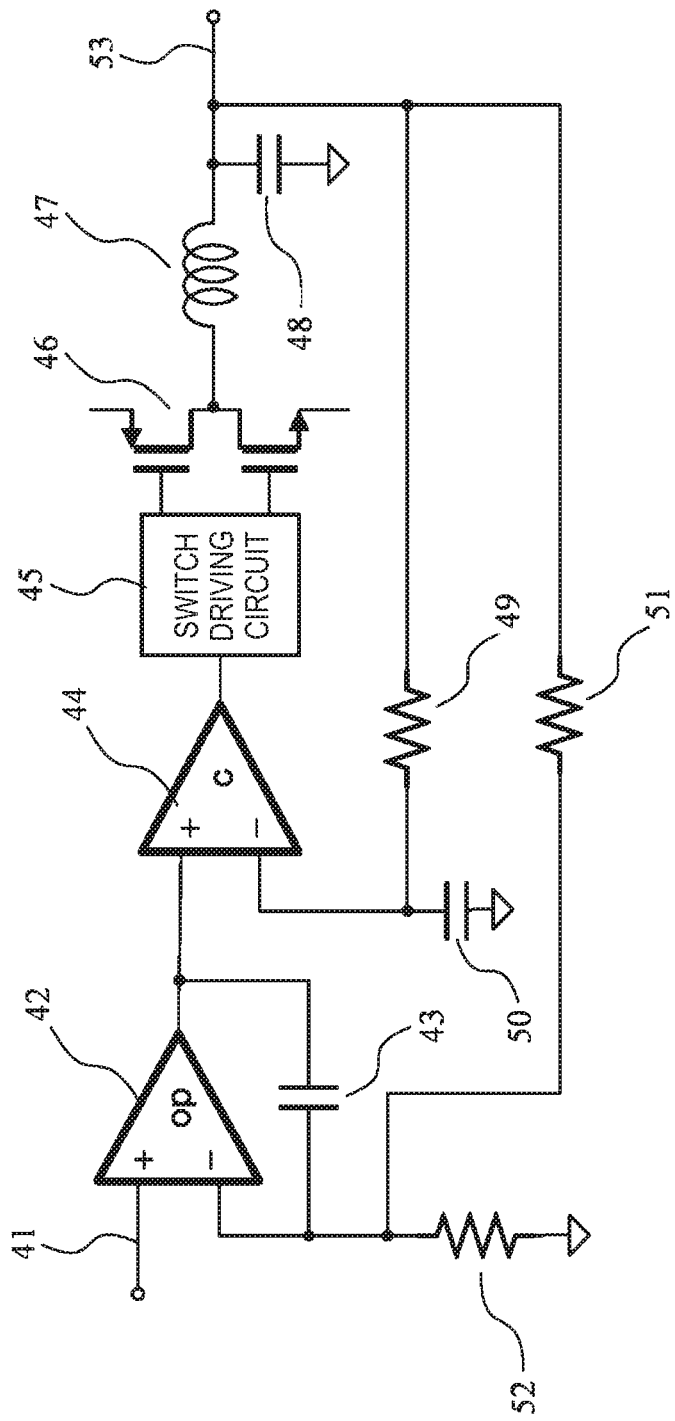
FIG. 4 shows a circuit example of the conventional self-oscillating class D amplifier.

FIG. 3B is a view showing a modification of the second feedback circuit 28. Although the amount of the phase compensation is slightly suppressed by the resistor 313 connected in series with a capacitor 312, the phase compensation of the feedback signal is performed basically same as in the case illustrated in FIG. 3A, and the operation of the amplifier 20 becomes stable.

With the circuit illustrated in FIG. 2, no high voltage is applied to the inputs of the operational amplifier 21 and the comparator 24, whereby semiconductor devices having high breakdown voltages are not required to be used as these devices.

The specific circuit configurations according to the above-mentioned embodiments are not limited to those described above, but can be modified and implemented as necessary. For example, the configurations of the integration circuit 22, the first feedback circuit 27 and the second feedback circuit 28 are not limited to those illustrated in the drawings. Differentiation circuits may be used for the first feedback circuit 27 and the second feedback circuit 28.

Here, the details of the above embodiments are summarized as follows.

(1) The disclosure provides a self-oscillating class D amplifier comprising:
an integration circuit configured to integrate an input signal and output a result of the integration as an integrated signal;
a comparator, having a non-inverting input terminal being grounded and an inverting input terminal, and configured to receive the integrated signal at the inverting input terminal and output a pulse width modulation signal by comparing voltages of the non-inverting input terminal and the inverting input terminal;
a switching circuit configured to power-amplify the pulse width modulation signal output from the comparator;
a low-pass filter configured to extract an amplified output signal from the power-amplified pulse width modulation signal;
a first feedback circuit configured to feed back the output signal of the low-pass filter to the inverting input terminal of the comparator; and
a second feedback circuit configured to feed back the output signal of the low-pass filter to the integration circuit.

(2) For example, the second feedback circuit feeds back the output signal of the low-pass filter to a non-inverting input terminal of the integration circuit.

(3) For example, the self-oscillating class D amplifier further comprises:
a first resistor disposed so as to precede the integration circuit; and
a second resistor disposed so as to precede the comparator,
wherein the integration circuit integrates the input signal received through the first resistor; and
wherein the comparator receives at the inverting input terminal the integrated signal which has passed through the second resistor.

(4) For example, the second feedback circuit is formed of a resistor.

(5) For example, the second feedback circuit comprises a capacitor connected in parallel with the resistor.

What is claimed is:
1. A self-oscillating class D amplifier comprising:
an integration circuit configured to integrate an input signal and output a result of the integration as an integrated signal;
a comparator, having a non-inverting input terminal being grounded and an inverting input terminal, and configured to receive the integrated signal at the inverting input terminal and output a pulse width modulation signal by comparing a ground voltage of the grounded non-inverting input terminal and a voltage of the inverting input terminal;
a switching circuit configured to power-amplify the pulse width modulation signal output from the comparator;
a low-pass filter configured to extract an amplified output signal from the power-amplified pulse width modulation signal;
a first feedback circuit configured to feed back the output signal of the low-pass filter to the inverting input terminal of the comparator; and
a second feedback circuit configured to feed back the output signal of the low-pass filter to the integration circuit.
2. The self-oscillating class D amplifier according to claim 1, wherein the second feedback circuit includes a resistor.
3. The self-oscillating class D amplifier according to claim 2, wherein the second feedback circuit comprises a capacitor connected in parallel with the resistor.
4. A self-oscillating class D amplifier comprising:
an integration circuit configured to integrate an input signal and output a result of the integration as an integrated signal;
a comparator, having a non-inverting input terminal being grounded and an inverting input terminal, and configured to receive the integrated signal at the inverting input terminal and output a pulse width modulation signal by comparing voltages of the non-inverting input terminal and the inverting input terminal;
a switching circuit configured to power-amplify the pulse width modulation signal output from the comparator;
a low-pass filter configured to extract an amplified output signal from the power-amplified pulse width modulation signal;
a first feedback circuit configured to feed back the output signal of the low-pass filter to the inverting input terminal of the comparator; and a second feedback circuit configured to feed back the output signal of the low-pass filter to the integration circuit, wherein the second feedback circuit feeds back the output signal of the low-pass filter to a non-inverting input terminal of the integration circuit.

5. The self-oscillating class D amplifier according to claim 4, further comprising:

a first resistor disposed so as to precede the integration circuit; and a second resistor disposed so as to precede the comparator, wherein the integration circuit integrates the input signal received through the first resistor; and wherein the comparator receives at the inverting input terminal the integrated signal which has passed through the second resistor.

\* \* \* \* \*